United States Patent [19]
Yagi et al.

[11] Patent Number: 5,866,021
[45] Date of Patent: Feb. 2, 1999

[54] METHOD OF MANUFACTURING MICRO-TIP AND FEMALE MOLD SUBSTRATE THEREFOR, AND METHOD OF MANUFACTURING PROBE WITH MICRO-TIP AND THE PROBE

[75] Inventors: Takayuki Yagi, Yokohama; Tsutomu Ikeda, Hachioji; Yasuhiro Shimada, Hadano, all of Japan

[73] Assignee: Canon Kabushiki Kaisha, Tokyo, Japan

[21] Appl. No.: 713,228

[22] Filed: Sep. 12, 1996

[30] Foreign Application Priority Data

Sep. 14, 1995 [JP] Japan ................................. 7-262312

[51] Int. Cl.⁶ .................................................. B44C 1/22
[52] U.S. Cl. .................................................. 216/84
[58] Field of Search .................................................. 216/84

[56] References Cited

U.S. PATENT DOCUMENTS

| | | | |
|---|---|---|---|
| 5,187,367 | 2/1993 | Miyazaki et al. | 250/306 |
| 5,221,415 | 6/1993 | Albrecht et al. | 156/629 |
| 5,313,451 | 5/1994 | Yagi et al. | 369/126 |
| 5,334,835 | 8/1994 | Nakayama et al. | 250/306 |
| 5,398,229 | 3/1995 | Nakayama et al. | 369/126 |
| 5,454,146 | 10/1995 | Yagi et al. | 29/25.35 |
| 5,546,375 | 8/1996 | Shimada etal. | 369/126 |
| 5,658,698 | 8/1997 | Yagi et al. | 430/11 |

FOREIGN PATENT DOCUMENTS 6-084455  3/1994  Japan .

OTHER PUBLICATIONS

G. Binning, et al., "Surface Studies by Scanning Tunneling Miroscopy", Physical Review Letters, vol. 49, No. 1, pp. 57–61 (Jul. 5, 1982).

E.E. Ehrichs, et al., "Nanofabrication with the STM", Proceedings of 4th International Conference on Scanning Tunneling Microscopy/Spectroscopy, p. 109 (Jul. 9–14, 1989).

O. Wolter, et al., "Micromachined Silicon Sensors for Scanning Force Microscopy", J. Vac. Sci. Technol., B9(2), pp. 1353–1357 (Mar./Apr. 1991).

C.A. Spindt, et al., "Physical Properties of Thin–Film Field Emission Cathodes with Molybdenum Cones", Journal of Applied Physics, vol. 47, No. 12, pp. 5248–5263 (Dec. 1976).

S. Nonogaki, "Micropatterning and Resist", the Society of Polymers ed., pp. 8–17, Kyoritsu–shuppan (1990).

*Primary Examiner*—Marian C. Knode
*Assistant Examiner*—Brenda G. Brynback
*Attorney, Agent, or Firm*—Fitzpatrick, Cella, Harper & Scinto

[57] ABSTRACT

A micro-tip is manufactured by forming a recess portion on a first substrate consisting of monocrystalline silicon for forming a tip. A peeling layer is formed on the recess portion, and contact layer is formed on at least a portion other than the peeling layer on the substrate. A tip material layer is formed on the peeling layer and the contact layer. The tip material layer on the peeling layer is transferred onto a second substrate.

15 Claims, 13 Drawing Sheets

METHOD OF MANUFACTURING MICRO-TIP AND FEMALE MOLD SUBSTRATE THEREFOR, AND METHOD OF MANUFACTURING PROBE WITH MICRO-TIP AND THE PROBE

BACKGROUND OF THE INVENTION

1. Field of the Invention

The present invention relates to a method of manufacturing a micro-tip used in a scanning tunneling microscope, an atomic force microscope for detecting a very weak force, or the like and a female mold substrate used in the manufacture of the micro-tip, and a method of manufacturing a probe having the micro-tip and the probe and, more particularly, to a method of manufacturing a micro-tip, that allows mass production of a tip, which has a small curvature at its distal end, exhibits excellent characteristics in the above-mentioned application, and can realize a multi-tip structure.

2. Related Background Art

In recent years, a scanning tunneling microscope (to be abbreviated as an "STM" hereinafter) that allows direct observation of the electron structures of atoms on conductor surfaces has been developed (G. Binnig et al., *Phys. Rev. Lett.*, 49, 57 (1983)), and a real space image can be measured at a high resolution independently of single-crystal or amorphous materials. Such STM utilizes a tunneling current that flows across a metal tip and a conductive material when a voltage is applied across them and the tip is brought close to a distance of about 1 nm to the conductive material.

This current is very sensitive to a change in distance between the tip and the conductive material, and changes exponentially. Hence, by scanning the tip to maintain a constant tunneling current, the surface structure of a real space can be observed at a resolution on the atomic order.

Objects that can be analyzed using the STM are limited to conductive materials. However, recently, the STM is often applied to structural analysis of a thin insulating layer formed on the surface of a conductive material.

Furthermore, the above-mentioned device and means allow observation of a medium with low electric power without damaging it since they use a method of detecting a very weak current.

Since the STM can operate in air, extensive studies have been made for its applications to various fields such as observation/evaluation and micropatterning of semiconductors or polymers on the atomic or molecular order (E. E. Ehrichs, Proceedings of 4th International Conference on Scanning Tunneling Microscopy/Spectroscopy, "89, S13-3), an information recording/reproduction apparatus, and the like, using the STM technique.

For example, upon applying the STM to an information recording/reproduction apparatus, the distal end portion of a tip of the STM preferably has a small radius of curvature to attain a high recording density.

At the same time, in view of improvement in function, especially an increase in speed of the recording/reproduction system, it is proposed to simultaneously drive a large number of probes (multi-tip structure). For this purpose, however, tips having uniform characteristics must be manufactured on a single substrate.

An atomic force microscope (to be abbreviated as an "AFM" hereinafter) can measure a three-dimensional pattern image on the specimen surface independently of conductors or insulators since it can detect a repulsive force or attractive force acting on the surface of a substance.

The AFM uses a micro-tip formed on the free end of a thin-film cantilever. As in the STM, in order to increase the resolution of the AFM, the distal end portion of the tip is required to have a small radius of curvature.

As a conventional method of forming the above-mentioned micro-tip, a micro-tip formed by anisotropic etching of monocrystalline silicon using a semiconductor manufacturing process is known (U.S. Pat. No. 5,221,415). In the method of forming a micro-tip, as shown in FIG. 1, a pit 518 is formed by anisotropic etching on a silicon wafer 514 coated with silicon dioxide masks 510 and 512, and is used as a female mold of a tip. After the silicon dioxide masks 510 and 512 are removed, the two surfaces of the wafer 514 are coated with silicon nitride layers 520 and 521 to form a pyramid-shaped pit 522 which is to serve as a cantilever and a micro-tip. After the pit 522 is patterned into a cantilever shape, the silicon nitride layer 521 on the rear surface is removed. Then, a glass plate 530 with a SAW-cut 534 and a Cr layer 532 is joined to the silicon nitride layer 520. Thereafter, the silicon wafer 514 is removed by etching, thus manufacturing a probe which is transferred to a mounting block 540 and is constituted by the silicon nitride tip and the cantilever.

Finally, a metal film 542 serving as a reflection film for an optical lever type AFM is formed.

Also, the following methods are available. That is, in another manufacturing method, as shown in (a) in FIG. 2, a thin film layer on a silicon substrate 611 is patterned into a circular shape, the silicon is etched using the patterned thin film layer as a mask 612, and a tip 613 is formed by utilizing side etching (O. Wolter, et al., "Micromachined silicon sensors for scanning force microscopy", *J. Vac. Sci. Technol.* B9(2), Mar/Apr, 1991, pp. 1353–1357). In still another manufacturing method, as shown in (b) in FIG. 2, a conductive material 625 is obliquely deposited onto a substrate 621 via a reverse-tapered resist aperture portion 624 of a resist film 622 while rotating the substrate 621, and is lifted off (C. A. Spindt, et al., "Physical properties of thin film field emission cathode with molybdenum cones", *J. Appl. Phys.*, 47, 1976, pp 5248–5263).

However, the conventional micro-tip manufacturing method suffers the following problems.

For example, the conventional micro-tip manufacturing method shown in FIG. 1 suffers the following problems.

(1) Since the silicon substrate used as a female mold of a tip is removed by etching in a later process, it cannot be re-used, resulting in low productivity and high manufacturing cost.

(2) Since the silicon substrate used as a female mold of a tip is etched, deterioration of the tip material and the tip shape on the probe surface due to an etchant, and contamination from the etchant occur.

(3) When a tip for the STM is manufactured by coating the tip surface with a conductive material, since the tip is formed to have a sharp distal end, it is not easy to form a coating of the conductive material. When the tip surface is coated with the conductive material, grain clots of the conductive film appear, and it is difficult to control the grain clots with high reproducibility. In the STM that processes a very weak current, i.e., a tunneling current, it is difficult to obtain stable characteristics.

(4) Furthermore, when a micro-tip is formed on a thin-film cantilever, a reflection film is formed on the entire rear surface of a probe in an AFM, and the cantilever warps due to the film stress of the reflection film.

The conventional micro-tip manufacturing method shown in FIG. 2 suffers the following problem.

(5) Strict process management is required to make constant the etching condition for silicon upon forming a tip, the patterning condition for a resist, the deposition condition of a conductive material, and it is difficult to maintain accurate shapes such as the heights, the radii of curvature of distal ends, and the like of a plurality of micro-tips to be formed.

SUMMARY OF THE INVENTION

It is, therefore, an object of the present invention to provide a method of manufacturing a micro-tip, which can solve the various problems of the conventional micro-tip manufacturing method, allow reuse of a female mold used in the manufacture of a micro-tip, are free from deterioration of the material and the shape of a micro-tip and contamination from an etchant, can obviate the need for coating a micro-tip with a conductive thin film and forming a reflection film on the entire rear surface of a probe, can obtain a uniform shape with high reproducibility, and can easily realize a multi-tip structure, a female mold substrate used in the manufacture of the micro-tip, and a method of manufacturing a probe with the micro-tip and the probe.

In order to achieve the above object, there is provided a method of manufacturing a micro-tip, comprising the steps of:

forming a recess portion for forming a tip on a first substrate;

forming a peeling layer on the recess portion;

forming a contact layer on at least a portion, other than the peeling layer, on the substrate;

forming a tip material layer on the peeling layer and the contact layer; and transferring the tip material layer on the peeling layer onto a second substrate.

In order to achieve the above object, there is also provided a female mold substrate used in the manufacture of a micro-tip, comprising:

a peeling layer formed on a recess portion serving as a female mold of the substrate and adapted to peel a tip; and a contact layer formed on at least a portion, other than the peeling layer, on the substrate and coupled to a material of the tip more strongly than the peeling layer.

In order to achieve the above object, there is also provided a method of manufacturing a probe with a micro-tip, comprising the steps of:

forming a recess portion for forming a tip on a first substrate;

forming a peeling layer on the recess portion;

forming a contact layer on at least a portion, other than the peeling layer, on the substrate;

forming a tip material layer on the peeling layer and the contact layer;

transferring the tip material layer on the peeling layer onto a second substrate; and forming a probe by processing the second substrate.

The above and other objects and features of the present invention will become apparent from the following description.

BRIEF DESCRIPTION OF THE DRAWINGS

FIGS. 6A and 6B are views for explaining a probe of the present invention, in which FIG. 6A is a top view of the probe, and FIG. 6B is a side view thereof;

FIGS. 10A and 10B are views for explaining a probe according to the sixth embodiment of the present invention, in which FIG. 10A is a perspective view of the probe, and FIG. 10B is a sectional view taken along a line 10B—10B in FIG. 10A;

DETAILED DESCRIPTION OF THE PREFERRED EMBODIMENTS

The preferred embodiments of the present invention will be described in detail below with reference to the accompanying drawings.

[First Embodiment]

Figure 3:
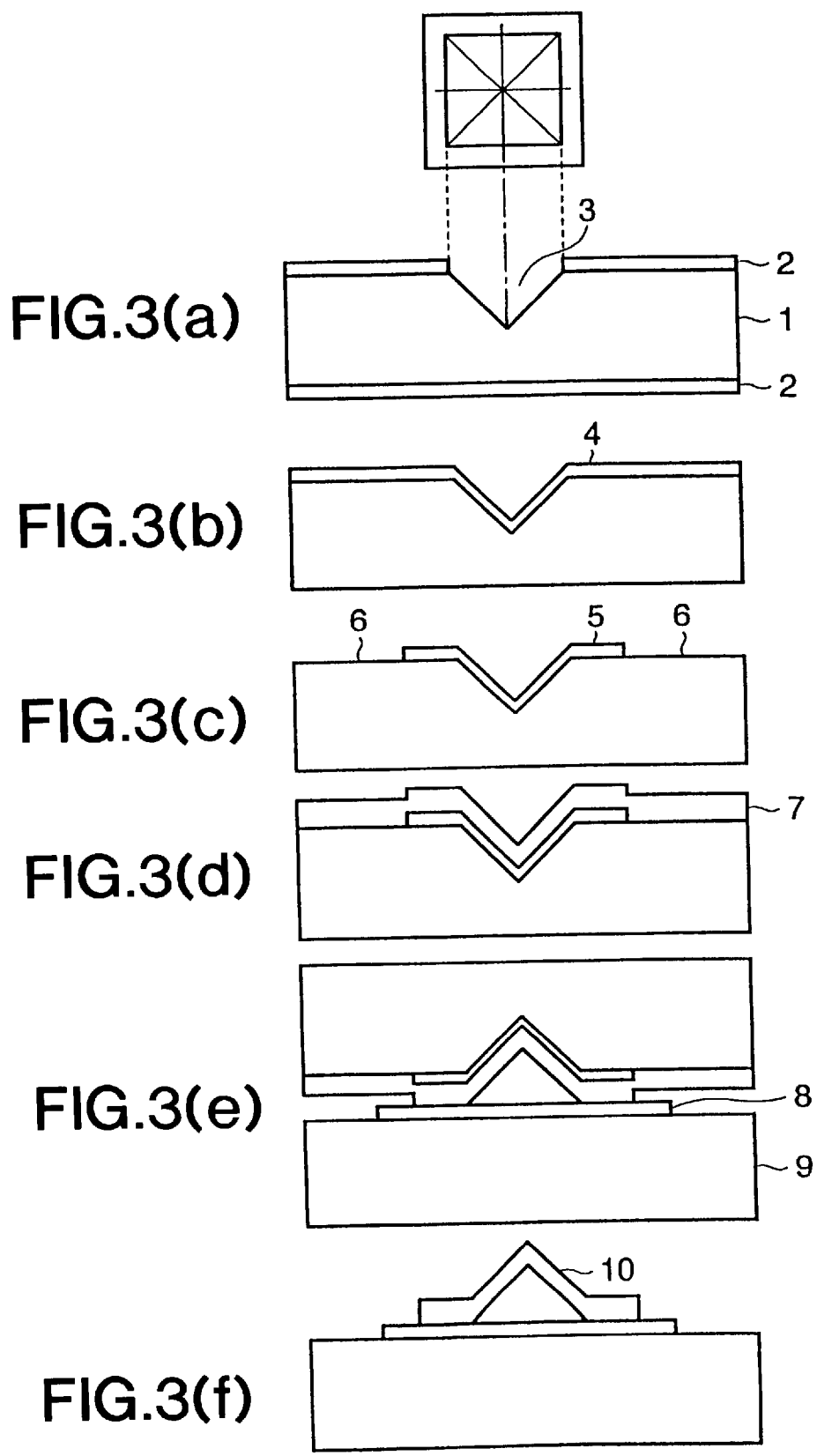
FIGS. 3(a)–3(f) are sectional views showing the manufacturing processes in a method of manufacturing a micro-tip according to the first embodiment of the present invention.

FIG. 3 is a sectional view showing the processes in a method of manufacturing a micro-tip according to the first embodiment of the present invention.

In (a) in FIG. 3, a silicon wafer which is formed with a protection layer 2 consisting of a silicon dioxide film formed by thermal oxidation in an oxidizing gas atmosphere, and has the <100> direction (crystal face orientation) was prepared as a first substrate 1.

Using a photoresist formed by a photolithography process as a mask, a desired portion of the protection layer 2 was etched using an aqueous HF solution to expose an 8-$\mu m^2$ silicon wafer portion therefrom.

The protection layer 2 serves as a protection layer upon forming a recess portion serving as a female mold for a micro-tip by crystallographic-axis anisotropic etching the first substrate 1, and has an etching resistance with respect to a crystallographic-axis anisotropic etchant.

After the photoresist was peeled, the first substrate was subjected to crystallographic-axis anisotropic etching using a 27% aqueous potassium hydroxide (KOH) solution at a solution temperature of 80° C. to form a 5.6-μm deep inverted-pyramid-shaped recess portion 3 surrounded by (111) planes.

Subsequently, the protection layer 2 was removed by etching using an aqueous HF solution, and thereafter, the first substrate 1 was thermally oxidized using an oxidizing gas, thereby forming a 1,000-Å thick silicon dioxide film 4 on the first substrate including the recess portion 3 ((b) in FIG. 3).

The silicon dioxide film 4 was patterned by a photolithography process and etching to form a peeling layer 5. A portion of the silicon dioxide film 4 was removed, and the silicon surface portion, exposed from the removed portion, of the first substrate was used as a contact layer 6 ((c) in FIG. 3).

As shown in (d) in FIG. 3, a 1-μm thick Au layer was formed on the entire surface of the first substrate by vacuum deposition, thus forming a tip material layer 7. Au as the tip material layer 7 and the contact layer 6 consisting of silicon can easily form an alloy and have a strong contact force.

On the contrary, the peeling portion 5 consisting of a silicon dioxide film and Au have a weak contact force therebetween, and can be easily peeled from each other.

In order to promote alloying of the tip material layer and the contact layer, the first substrate was subjected to a heat treatment at 100° C.

A silicon wafer was prepared as a second substrate 9, and a 50-Å thick Cr layer and a 1,000-Å thick Au layer were successively deposited in turn on the surface of the second substrate 9 by vacuum deposition to form a thin film. The thin film was patterned by a photolithography process and etching to form a joining layer 8 (not shown).

Subsequently, the tip material layer 7 on the first substrate 1 shown in (d) in FIG. 3 and the joining layer 8 on the second substrate were aligned and brought into contact with each other. Au as the tip material layer and Au as the joining layer were coupled and joined by a method of contacting the first and second substrates by pressurizing their rear surfaces ((e) in FIG. 3).

Thereafter, by peeling the first substrate from the interface between the peeling layer 5 and the tip material layer 7, only the tip material layer on the peeling layer 5 was transferred onto the joining layer 8, thus manufacturing a micro-tip 10 shown in (f) in FIG. 3.

Upon observing the micro-tip 10 manufactured by the above-mentioned method using an SEM (scanning electron microscope), the distal end of the tip had a replicated shape of the inverted pyramid formed by the crystallographic-axis anisotropic etching of silicon, i.e., the micro-tip had a sharp distal end, and the radius of curvature of the distal end of the micro-tip was 0.03 μm.

Figure 4:
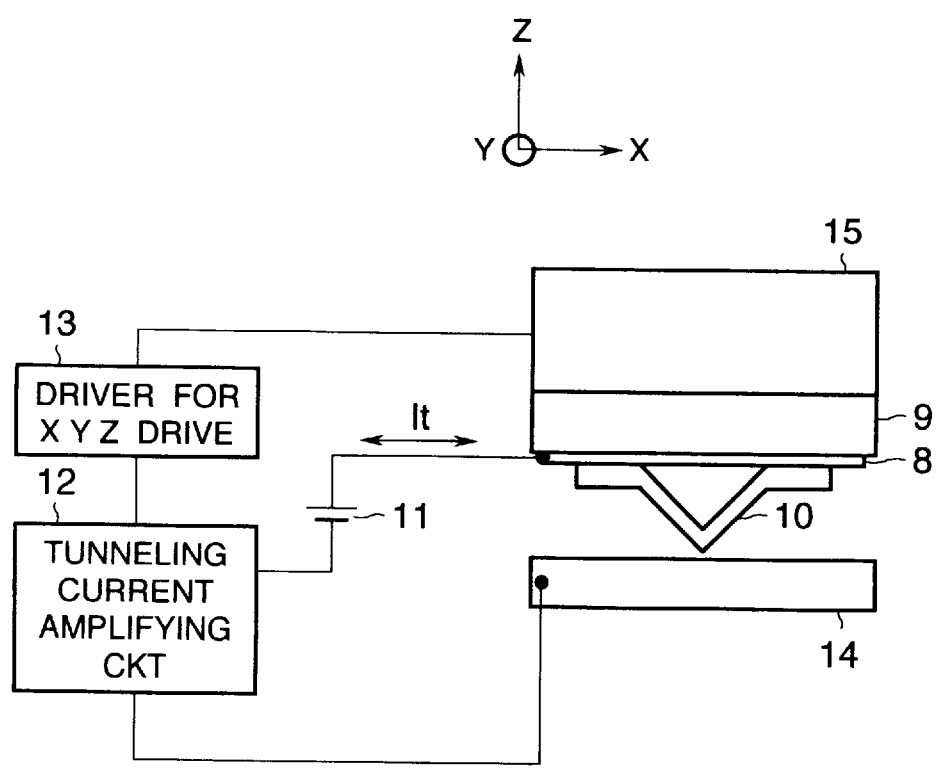
FIG. 4 is a block diagram showing an STM apparatus using the micro-tip according to the first embodiment of the present invention.

An STM apparatus using the micro-tip 10 of this embodiment was manufactured. FIG. 4 is a block diagram showing this apparatus.

Referring to FIG. 4, the apparatus includes a bias applying power supply 11, a tunneling current amplifying circuit 12, a driver 13 for XYZ drive, a second substrate 9, a joining layer 8, a micro-tip 10, a specimen 14, and an XYZ-axis drive piezoelectric element 15.

In this apparatus, a tunneling current It that flows across the micro-tip 10 and the specimen 14 is detected via the joining layer 8, and the detected current is fed back to make it constant to drive the XYZ-axis drive piezoelectric element 15 in the Z-direction, thus maintaining a constant spacing between the micro-tip and the specimen.

In this embodiment, the joining layer was used as a tunneling current output electrode. Furthermore, by driving the XYZ-axis drive piezoelectric element 15 in the X- and Y-directions, an STM image as a two-dimensional image of the sample 14 can be observed.

Upon observing the cleaved surface of an HOPG (high-orientation pyrolysis graphite) substrate as the specimen 14 under the conditions of a bias current of 1 nA and a scan area of 100 Å×100 Å, a good atomic image could be obtained with high reproducibility.

[Second Embodiment]

A method of manufacturing a micro-tip according to the second embodiment of the present invention will be described below.

As the first substrate of this embodiment, a first substrate shown in (d) in FIG. 3 formed in the processes of forming a tip material layer shown in (a) to (d) in FIG. 3 of the first embodiment was used.

As the second substrate, a silicon wafer was prepared. A 1,000-Å thick Al thin film was formed on the surface of the silicon wafer by vacuum deposition, and was patterned by a photolithography process and etching, thereby forming a joining layer.

Subsequently, the Au tip material layer on the first substrate and the Al joining layer on the second substrate were aligned and brought into contact with each other.

Upon contacting, the resultant structure was left to stand in an $N_2$ atmosphere at a temperature of 300° C. for an hour. With this process, an Al-Au alloy was formed at the interface between the joining layer and the tip material layer, thus joining the tip material layer and the joining layer.

Thereafter, when the first substrate was peeled from the interface between the peeling layer 5 and the tip material layer, only the tip material layer on the peeling layer 5 was transferred onto the Al joining layer, thus manufacturing a micro-tip.

Upon observing the micro-tip manufactured by the above-mentioned method using an SEM, the distal end of the tip had a replicated shape of the inverted pyramid formed by the crystallographic-axis anisotropic etching of silicon, i.e., the micro-tip had a sharp distal end, and the radius of curvature of the distal end of the micro-tip was 0.03 μm as in the first embodiment.

The tip material layer left on the contact layer on the first substrate was removed by etching using an aqueous solution mixture of iodine and potassium iodide, and thereafter, a 1-μm thick Au layer was formed on the first substrate by vacuum deposition to form a tip material layer. Then, following the same procedure as in (e) in FIG. 3 in the first embodiment, the tip material layer on the peeling layer on the first substrate could be transferred to the joining layer on the second substrate.

As a result, the first substrate serving as a female mold of a micro-tip was found to be reusable. The radius of curvature of the distal end of this micro-tip was 0.03 μm, and was equal to that of the micro-tip formed before reuse.

[Third Embodiment]

A case will be exemplified below as the third embodiment of the present invention wherein a plurality of micro-tips are formed. Micro-tips were formed following substantially the same arrangement and procedures as those in (a) to (f) in FIG. 3 in the first embodiment, except that a 1,000-Å Pt layer and a 1-μm thick Au layer were successively deposited as a tip material layer by an electron beam deposition method in turn to form a thin film.

Upon forming a plurality of micro-tips, a total of 100 joining layers were formed in a 10×10 matrix on the second substrate, 100 recess portions were formed on the first substrate to be paired with these joining layers, and micro-tips were formed on these joining layers. The pitch of the micro-tips was 200 μm.

Upon observing the plurality of micro-tips manufactured by the above-mentioned method using an SEM, the distal ends of all the micro-tips had replicated shapes of the inverted pyramid formed by the crystallographic-axis anisotropic etching of silicon, i.e., the micro-tips had sharp distal ends, and the radii of curvature of the distal ends of these micro-tips fell within the variation range of 0.03 μm+0.01 μm.

Also, variations in height of the tips from the joining layers fell within the range of +0.1 μm. It was found that the method of manufacturing a micro-tip of the present invention could form a plurality of micro-tips with uniform shapes.

[Fourth Embodiment]

Figure 5:
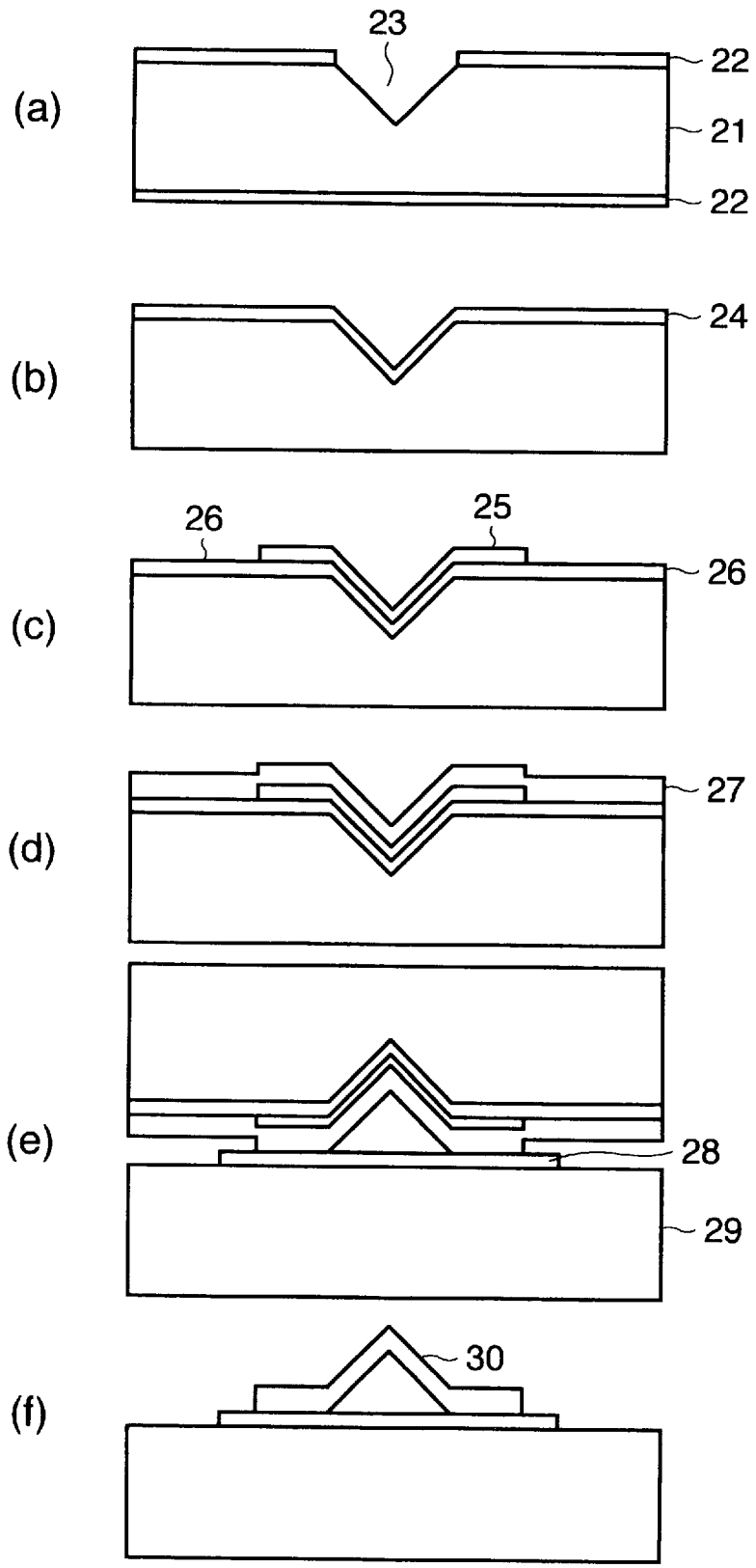
FIGS. 5(a)–5(f) are sectional views showing the manufacturing processes in a method of manufacturing a micro-tip according to the fourth embodiment of the present invention.

FIG. 5 is a sectional view showing the processes in the second method of manufacturing a micro-tip according to the fourth embodiment of the present invention.

In (a) in FIG. 5, a silicon wafer which is formed with a protection layer 22 consisting of a silicon dioxide film formed by thermal oxidation in an oxidizing gas atmosphere, and has the <100> direction (crystal face orientation) was prepared as a first substrate 21. Using a photoresist formed by a photolithography process as a mask, a desired portion of the protection layer 22 was etched using an aqueous HF solution to expose an 8-μm² silicon wafer portion therefrom.

The protection layer 22 serves as a protection layer upon forming a recess portion serving as a female mold for a micro-tip by crystallographic-axis anisotropic etching the first substrate 1, and has an etching resistance with respect to a crystallographic-axis anisotropic etchant.

After the photoresist was peeled, the first substrate was subjected to crystallographic-axis anisotropic etching using a 27% aqueous potassium hydroxide (KOH) solution at a solution temperature of 80° C. to form a 5.6-μm deep inverted-pyramid-shaped recess portion 23 surrounded (111) planes.

Subsequently, the protection layer 22 was removed by etching using an aqueous HF solution, and thereafter, a 0.1-μm thick Al film 24 was formed by vacuum deposition on the first substrate 21 ((b) in FIG. 5).

A photoresist was applied on the Al film 24 and was developed to form an aperture portion for a portion, which serves as a peeling layer to be formed in a later process, thus exposing the Al film therefrom.

A 900-Å thick Cr film was formed by vacuum deposition on the photoresist and the exposed Al film portion, and was patterned by a lift-off method for removing the photoresist by etching using a solvent, thereby forming a peeling layer 25. At the same time, the Al film portion exposed after this process was used as a contact layer 26 ((c) in FIG. 5).

As shown in (d) in FIG. 5, a 1-μm Au film serving as a micro-tip material was formed by vacuum deposition on the entire surface of the first substrate, thus forming a tip material layer 27.

Au as the tip material layer 27 and the contact layer 26 consisting of Al can easily form an alloy and have a strong contact force. On the contrary, Au has a weak contact force with respect to the peeling portion formed in the above process.

Pyrex (trade name #7059; available from Corning) was prepared as a second substrate 29, and a 50-Å thick Cr film and a 1,000-Å thick Au film were successively deposited in turn by vacuum deposition on the surface of the second substrate 29 so as to form a thin film. The thin film was patterned by a photolithography process and etching, thereby forming a joining layer 28.

Subsequently, the tip material layer 27 on the first substrate 21 shown in (d) in FIG. 5 and the joining layer 28 on the second substrate were aligned and brought into contact with each other. Upon contacting, Au as the tip material layer and Au as the joining layer were aligned and joined by a method of contacting the first and second substrates by pressurizing their rear surfaces ((e) in FIG. 5).

Thereafter, by peeling the first substrate from the interface between the peeling layer 25 and the tip material layer 27, only the tip material layer on the peeling layer 25 was transferred onto the joining layer 28, thus manufacturing a micro-tip 30 shown in (f) in FIG. 5.

Upon observing the micro-tip 30 manufactured by the above-mentioned method using an SEM (scanning electron microscope), the distal end of the tip had a replicated shape of the inverted pyramid formed by the crystallographic-axis anisotropic etching of silicon, i.e., the micro-tip had a sharp distal end, and the radius of curvature of the distal end of the micro-tip was 0.04 μm.

Note that a glass substrate was used as the second substrate. However, since the micro-tip is joined to the joining layer, the substrate to be used is not limited to a specific one, and various other substrates such as other insulator substrates of, e.g., quartz, $Al_2O_3$, MgO, $ZrO_2$, and the like, semiconductor substrates of Si, GaAs, InP, and the like, metal substrates, and the like may be used, needless to say.

[Fifth Embodiment]

As the fifth embodiment, a probe for an AFM, in which the micro-tip according to the first embodiment of the present invention was arranged on a thin-film cantilever consisting of silicon nitride, was manufactured.

Figure 6A:
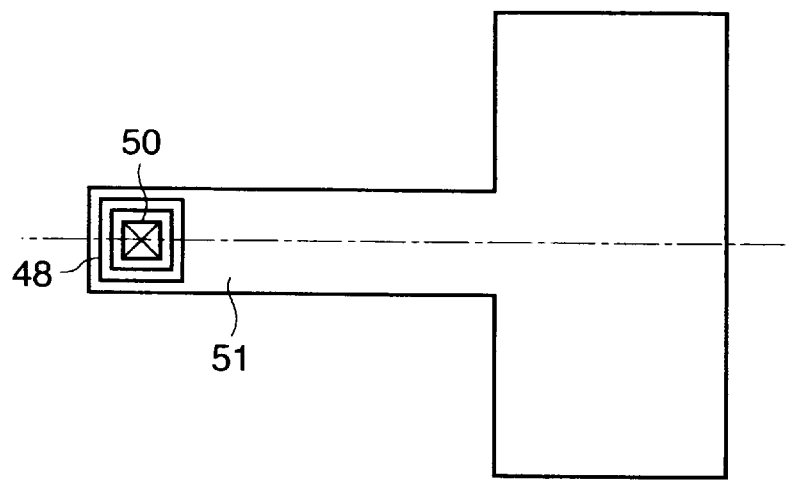
Figure 6B:
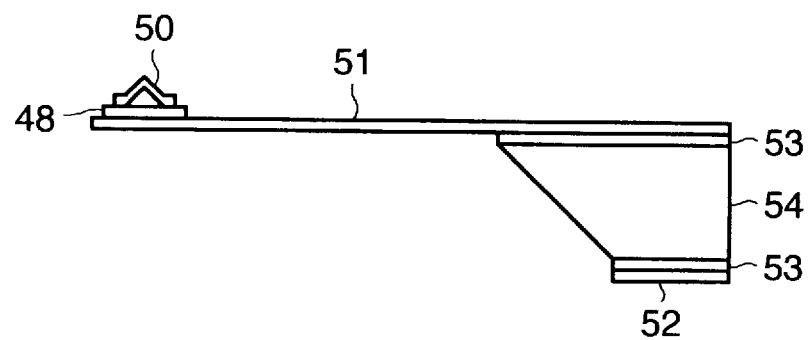
Figure 7A:
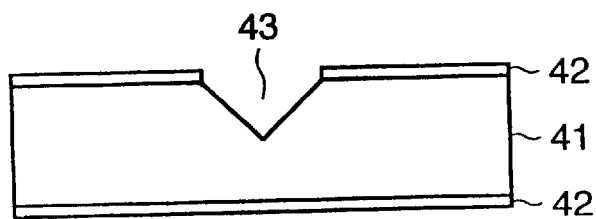
FIGS. 7(a)–7(e) are sectional views showing the manufacturing process in a method of manufacturing a probe according to the present invention.
Figure 7B:
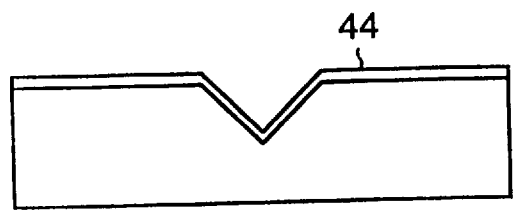
Figure 7C:
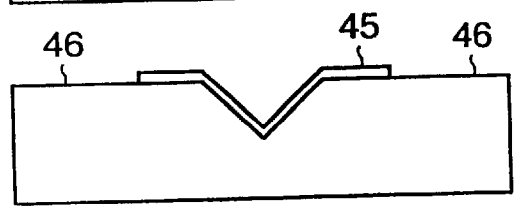
Figure 7D:
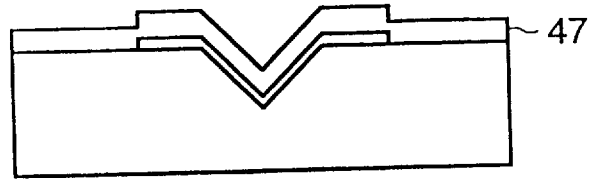
Figure 7E:
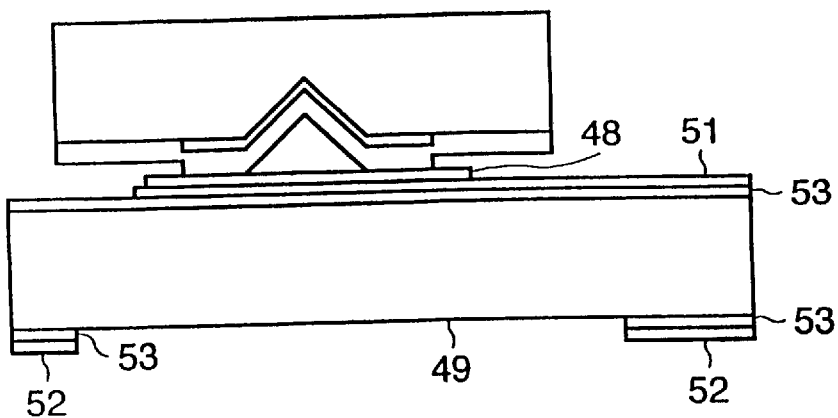

FIG. 6A is a top view of the manufactured probe, and FIG. 6B is a side view thereof.

The probe comprises a thin-film cantilever 51, a joining layer 48, a micro-tip 50, a silicon dioxide film 53, a silicon nitride film 52 used as a mask upon etching a silicon wafer from its rear surface side, and a silicon block 54 for fixedly supporting one end of the thin-film cantilever formed by etching the silicon wafer.

The processes in the manufacture of the probe will be explained below with reference to FIGS. 7 and 8.

(a) to (d) in FIG. 7 are sectional views showing the processes required until a tip material layer is formed.

The processes shown in (a) to (d) in FIG. 7 are the same as those shown in (a) to (d) in FIG. 3 in the first embodiment required until the tip material layer is formed. First, a first substrate 41 consisting of a silicon wafer formed with a protection layer 42, which consisted of a silicon dioxide film formed by thermal oxidation in an oxidizing gas, was subjected to crystallographic-axis anisotropic etching using the protection layer 42 as a mask, thus forming an inverted-pyramid-shaped recess portion 43 serving as a female mold of a micro-tip.

After the protection layer 42 was removed, a peeling layer 45 consisting of a silicon dioxide film 44 and a silicon contact layer 46 were formed, and a 1-μm thick Au film as a micro-tip material was formed thereon, thus forming a tip material layer 47.

A silicon wafer was prepared as a second substrate 49, and a 0.5-μm thick silicon dioxide film 53 was formed thereon. Subsequently, a 0.5-μm thick silicon nitride film, which serves as a thin-film cantilever 51 and a mask upon crystallographic-axis anisotropic etching the second substrate 49 from its rear surface in a later process, was formed by LP CVD (Low Pressure Chemical Vapour Deposition).

The film formation conditions of the silicon nitride film are: film formation temperature=848° C., flow rate ratio $NH_3$ : $SiH_2Cl_2$=10 ccm:20 ccm, and film formation pressure=0.2 torr.

After a photoresist cantilever pattern was formed by a photolithography process, the silicon nitride film on the upper surface of the second substrate was patterned into a thin-film cantilever shape shown in FIG. 6A by reactive ion etching using $CF_4$. Furthermore, those portions of the silicon nitride film 52 and the silicon dioxide film 53 on the rear surface, which correspond to the formation position of the thin-film cantilever 51, of the second substrate were patterned by a photolithography process and reactive ion etching, as shown in (e) in FIG. 7.

A 50-Å thick Cr film and a 1,000-Å thick Au film were successively deposited in turn by vacuum deposition on the free end of the thin-film cantilever 51 to form a thin film, which was patterned by a photolithography process and etching to form a joining layer 48.

Subsequently, the tip material layer 47 on the first substrate 41 and the joining layer 48 on the second substrate 49 were aligned and joined to each other ((e) in FIG. 7).

The joining process is attained using a method of contacting the first and second substrates by pressurizing their rear surfaces.

Figure 8:
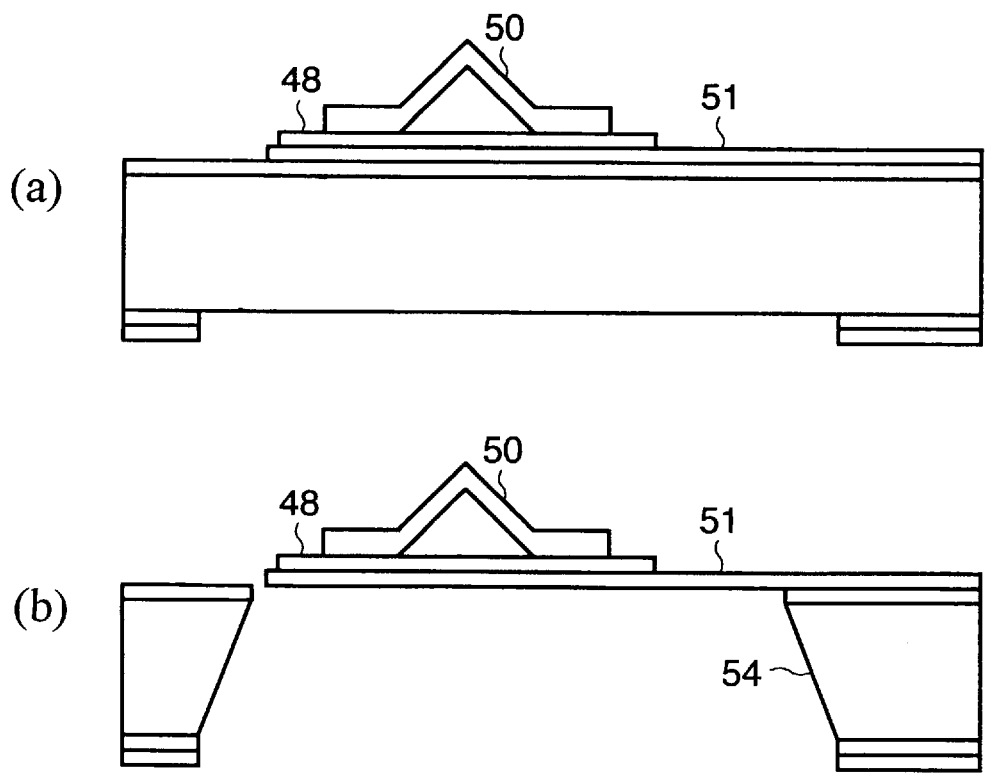
FIGS. 8(a) and 8(b) are sectional views showing the manufacturing process in a method of manufacturing a probe according to the present invention.

In this manner, the two Au layers were joined, i.e., the tip material layer 47 and the joining layer 48 were joined, and by peeling the first substrate from the second substrate after they were brought into contact with each other, only the Au layer on the peeling layer was transferred onto the joining layer 48, thus forming a micro-tip 50 ((f) in FIG. 8).

Subsequently, silicon was etched from the rear surface side of the second substrate by crystallographic-axis anisotropic etching using an aqueous potassium hydroxide solution, and the silicon dioxide film was removed using an aqueous HF solution from the rear surface side. In this manner, a probe which has the micro-tip 50 was formed on the joining layer of the free end of the thin-film cantilever, one end of which was fixed to the silicon block 54, could be formed ((g) in FIG. 8).

In the probe for an AFM, manufactured by the manufacturing method of the present invention, a laser beam can be reflected by the rear surface of the joining layer formed on the distal end of the thin-film cantilever so as to measure displacements, and hence, the joining layer can also serve as a reflection film.

With this structure, no reflection film need be formed on the entire rear surface of the thin-film cantilever, and the thin-film cantilever can be prevented from warping due to the film stress of the reflection film.

Figure 9:
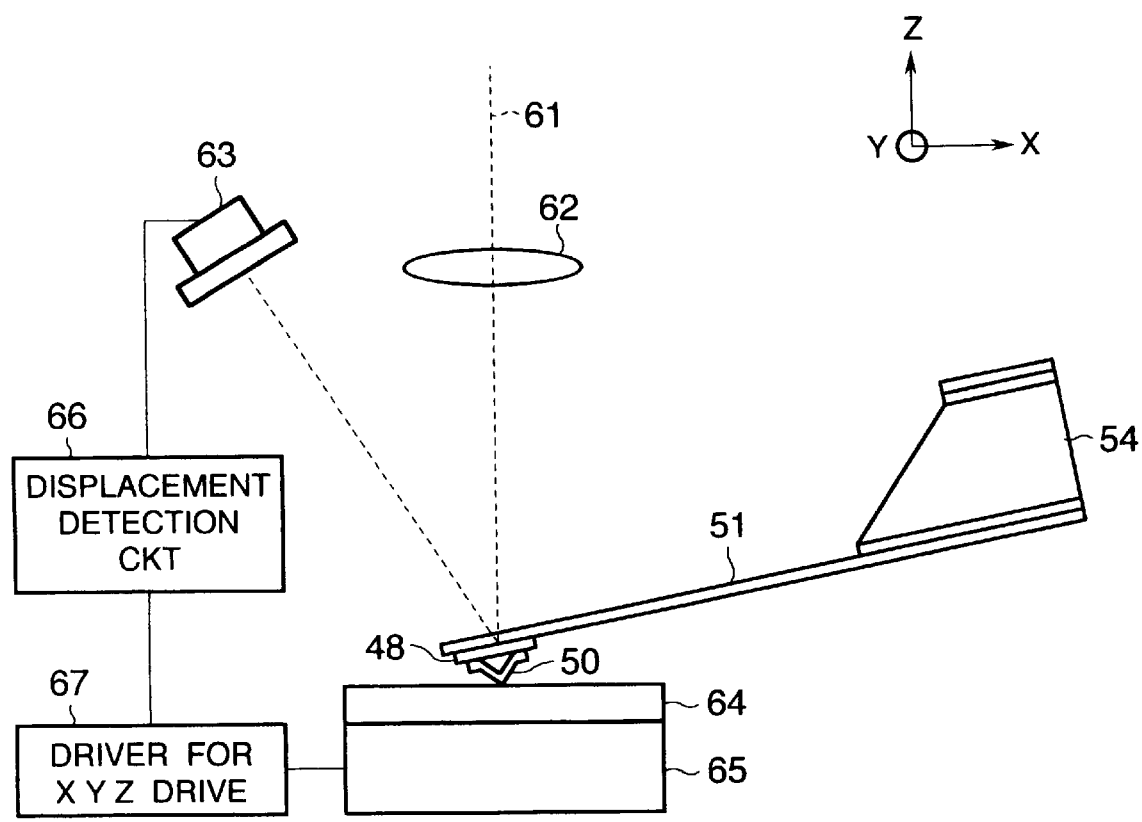
FIG. 9 is a block diagram showing an AFM apparatus using a probe according to the fifth embodiment of the present invention.

An optical lever type AFM apparatus using the probe of this embodiment was manufactured. FIG. 9 is a block diagram of this apparatus.

The AFM apparatus comprises a probe constituted by the thin-film cantilever 51, the joining layer 48, and the micro-tip 50 joined to the joining layer, a laser beam 61, a lens 62 for focusing the laser beam on the rear surface of the joining layer on the free end of the thin-film cantilever, a position sensor 63 for detecting a change in reflection angle of light due to a displacement of the thin-film cantilever, a displacement detection circuit 66 for detecting the displacement on the basis of a signal output from the position sensor, an XYZ-axis drive piezoelectric element 65, and a driver 67 for XYZ drive, which drives the XYZ-axis drive piezoelectric element 65 in the X-, Y-, and Z-directions.

After the probe was brought close to a specimen 64 consisting of mica, an AFM image of the specimen surface was observed using the AFM apparatus by driving the XYZ-axis piezoelectric element in the X- and Y-directions, thus observing step images of the mica surface.

[Sixth Embodiment]

As the sixth embodiment, a probe for an AFM or STM, in which the micro-tip according to the first embodiment of the present invention is formed on a thin-film flat plate consisting of crystalline silicon, was manufactured.

Figure 10A:
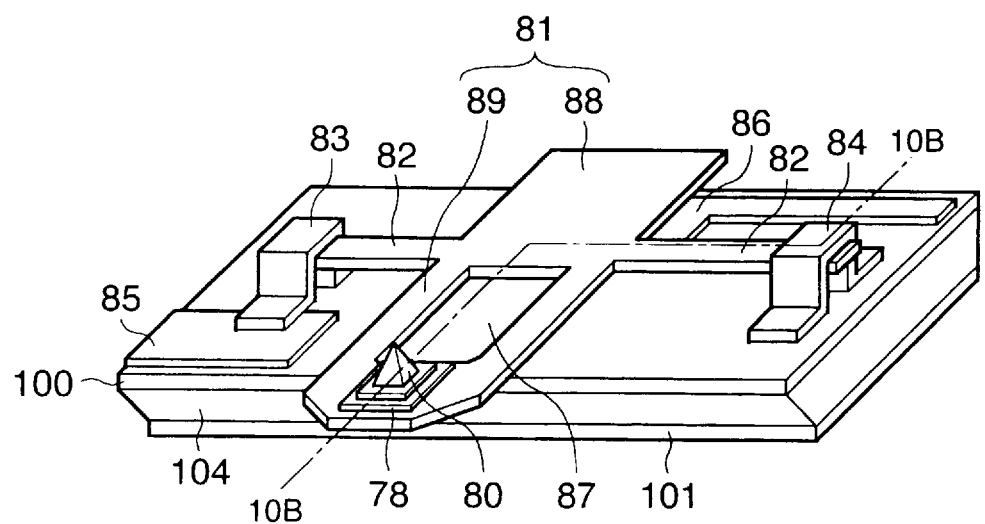
Figure 10B:
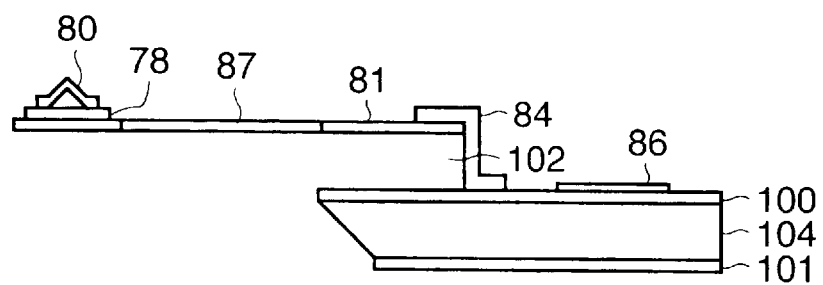

FIG. 10A is a perspective view of the manufactured probe, and FIG. 10B is a sectional view taken along a line 10B—10B in FIG. 10A. This probe has the following structure, as shown in FIGS. 10A and 10B.

Silicon nitride films 100 and 101 having stationary electrodes 85 and 86 are formed on a silicon block 104. A thin-film flat plate 81 consists of n-type crystalline silicon with conductivity, has torsion beams 82 on its side surfaces, and depends from the upper surfaces of the torsion beams 82 by support portions 83 and 84 via a gap 102.

The thin-film flat plate 81 has a flat-plate electrode portion 88, and a flexible beam 89 having a joining layer 78 and a micro-tip 80 formed on the joining layer on one end and also having an aperture portion 87.

The stationary electrode 86 is formed on the silicon nitride film 100 to oppose the flat-plate electrode portion 88.

The support portions 83 and 84 consist of electrical conductors of an Al film, the joining layer consists of Pt, and the micro-tip consists of Au formed following the same procedures as in the first embodiment. The support portion 83 is electrically connected to the thin-film flat plate 81 and the stationary electrode 85, and also to the micro-tip 80 via the thin-film flat plate 81 and the joining layer 78.

Hence, each support portion mechanically and electrically connects the thin-film flat plate 81 via the torsion beam 82 in an air bridge structure.

The probe with the above-mentioned arrangement has an electrostatic actuator function. That is, when a voltage is applied across the stationary electrodes 86 and 85, an electrostatic attractive force is generated across the stationary electrode 86 and the flat-plate electrode portion 88, and the torsion beams torsionally rotate. As a result, the flat-plate electrode portion is displaced toward the silicon block, and the micro-tip is displaced toward the side opposite to the displacement direction of the flat-plate electrode portion, i.e., the thin-film flat plate 81 is rotation-displaced about the axis of rotation of the torsion beams.

The probe with such an electrostatic actuator can be used as a probe for an AFM since it has a micro-tip on the free end of a flexible beam, and can also be used as a probe for an STM since the micro-tip and the thin-film flat plate are electrically conductive. Furthermore, this probe can be used as a composite type probe for an STM/AFM.

Figure 1:
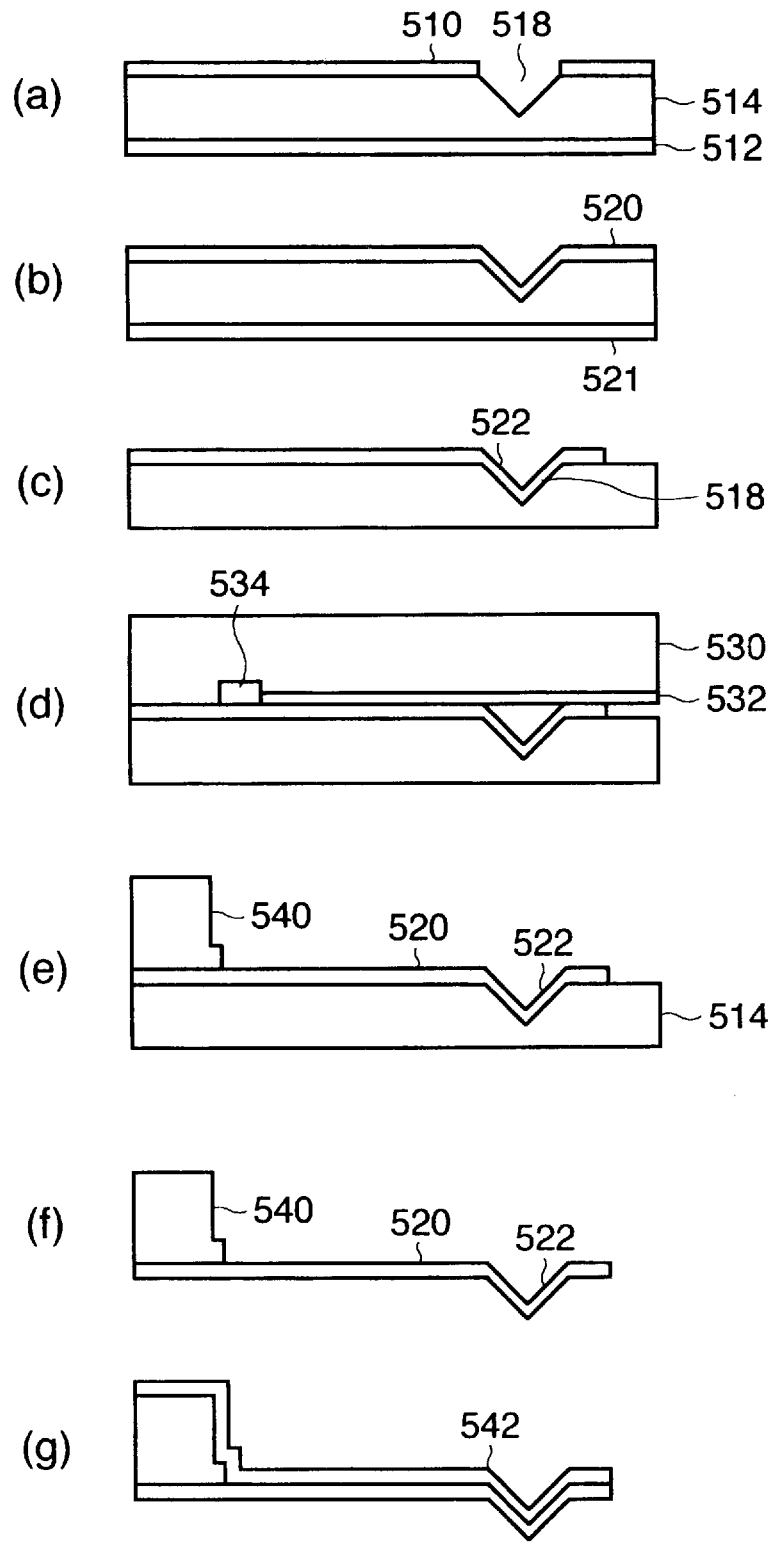
FIGS. 1(a)–1(g) are sectional views showing the principal processes in a conventional method of manufacturing a micro-tip.
Figure 2:
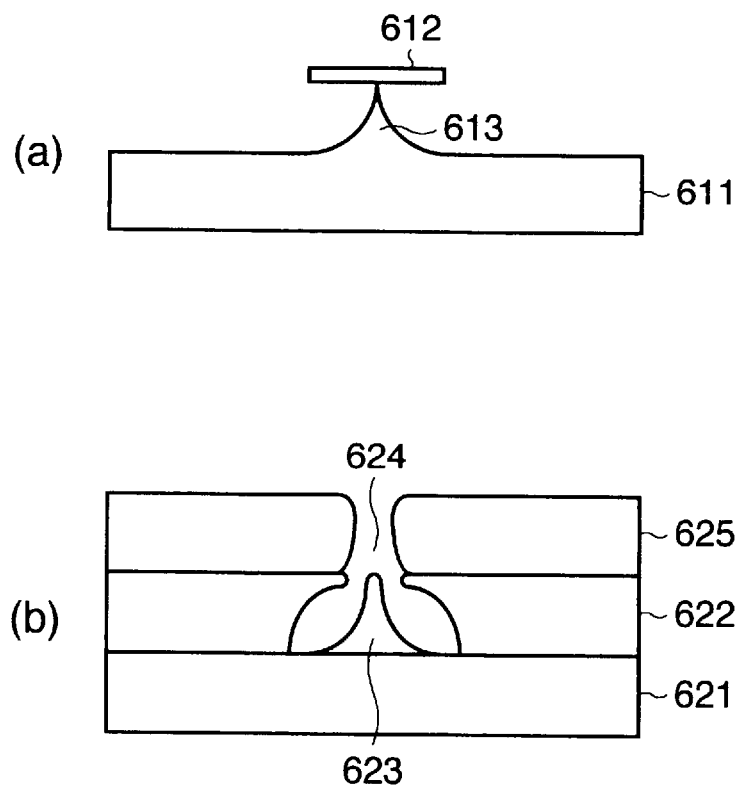
FIGS. 2(a) and 2(b) are sectional views showing the manufacturing processes of a micro-tip in other conventional methods.

When the probe of the present invention is used in the STM apparatus shown in FIG. 2, the micro-tip can be displaced by applying a voltage across the stationary electrodes 85 and 88 in place of the driving operation of the XYZ-axis drive piezoelectric element in the Z-direction.

Figure 11:
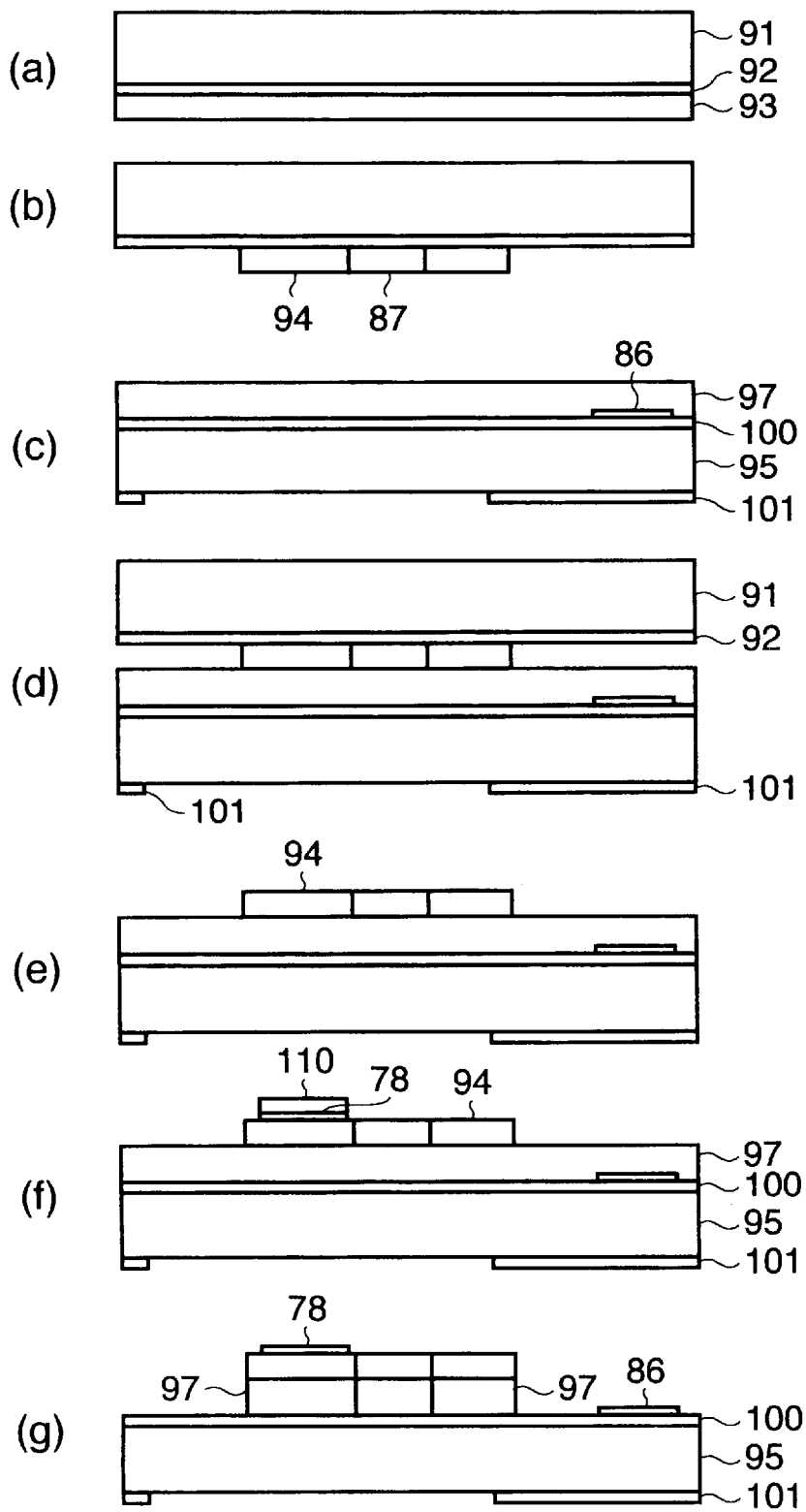
FIGS. 11(a)–11(g) are sectional views showing the manufacturing processes in a method of manufacturing a probe according to the sixth embodiment of the present invention.
Figure 12:
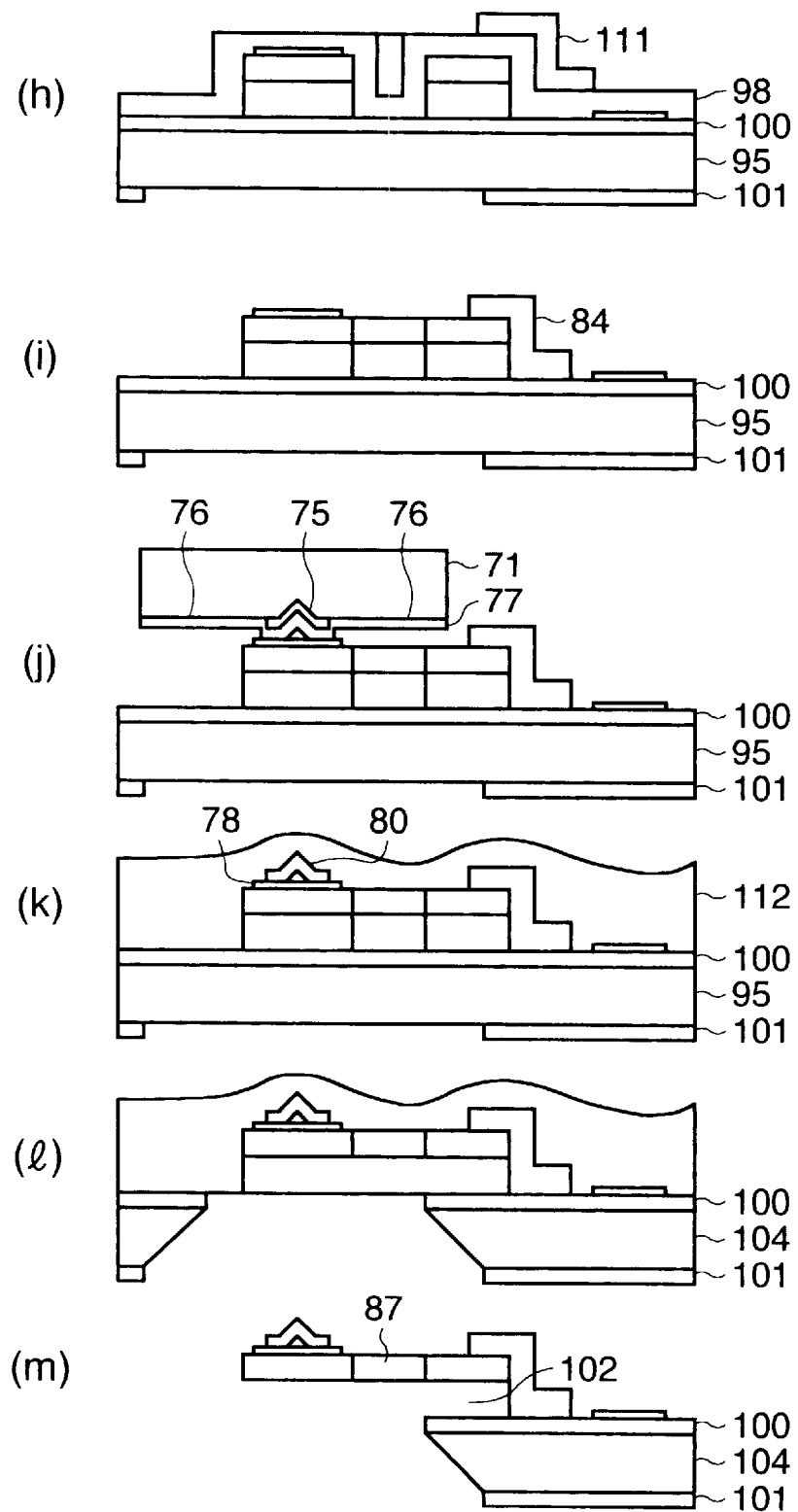
FIG. 12(h)–12(m) are sectional views showing the manufacturing processes in a method of manufacturing a probe according to the sixth embodiment of the present invention.

FIGS. 11 and 12 are sectional views for explaining the method of manufacturing a probe according to the sixth embodiment of the present invention.

The manufacturing method of this embodiment in the sectional view of the probe taken along a line 10B—10B in FIG. 10A will be explained below with reference to FIGS. 11 and 12.

As a third substrate, an SOI (Si on Insulator) substrate was used ((a) in FIG. 11). The SOI substrate was constituted by forming an n-type crystalline silicon film 93 (sheet resistance=30 $\Omega/\square$, thickness=1 $\mu$m), which was to serve as a thin-film flat plate 81 in a later process, was formed on a silicon substrate 91 via an insulating layer 92 of a silicon dioxide film.

A photoresist was applied on the substrate, and was patterned using a photolithography process that performed exposure and development. Using the patterned photoresist as a mask, the crystalline silicon film 93 was etched by reactive ion etching (RIE) using $CF_4$ gas, thus forming a beam pattern 94 with an aperture portion 87. The beam pattern 94 serves as a thin-film flat plate in a later process. The photoresist was peeled using a resist peeling solution, thus manufacturing the third substrate having the beam pattern shown in (b) in FIG. 11.

As a second substrate to be adhered to the third substrate, a silicon substrate 95 was prepared. A silicon nitride film, which serves as a mask upon crystallographic-axis anisotropic etching the silicon substrate 95 from the rear surface side, was formed by LP CVD (Low Pressure Chemical Vapour Deposition). The film formation conditions of the silicon nitride film are: film formation temperature=848° C., flow rate ratio $NH_3$: $SiH_2Cl_2$=10 ccm: 20 ccm, and film formation pressure=0.2 torr.

A portion of a silicon nitride film 101 on the rear surface side at a position, where the thin-film flat plate 81 was formed on the second substrate via a gap in a later process, was patterned using a photolithography process and reactive ion etching using $CF_4$, as shown in (c) in FIG. 11.

The stationary electrodes 85 and 86 were formed in such a manner that a 100-nm Pt film was formed by a sputtering method using a Pt target, a photoresist was patterned by a photolithography process, the Pt film was subjected to ion milling by Ar ions using the photoresist as a mask, the photoresist was removed, and the Pt film was then patterned, as shown in FIGS. 10A and 10B.

An adhesion layer 97 as a resin film was applied on the second substrate by the spinner method. As the resin film, rubber-based photo resist OMR-83 (trade name: available from Tokyo Oka (K.K.)) as a photoresist was used ((c) in FIG. 11).

Note that bubbles often remain between the adhesion layer and the third substrate unless the content of a solvent contained in a solution that is used to dissolve a resin upon applying is adjusted.

A pre-heat treatment is performed at a temperature at which the resin is not cured, to adjust the content of the solvent contained in a resin film, thereby preventing bubbles from remaining at the interface. Hence, the adhesion layer 97 was subjected to a pre-heat treatment at 50° C. for 15 minutes.

As another process of forming an adhesion layer, a resin film formation method for forming a coating by the dipping method, the spray method, or the like may be used.

With the coating method, even when the surface of the substrate is roughened, the resin film can be applied with high flatness. Therefore, in a process of adhering the adhesion layer to the third substrate, satisfactory surface adhesion can be attained independently of the surface roughness of the substrate and the steps of the stationary electrodes.

As the resin material, a photoresist which has a small impurity content of, e.g., sodium ions is preferably used when a resin film is formed on an Si substrate on which a circuit is integrated.

More preferably, a rubber-based photoresist (e.g., a rubber-based photoresist described in Saburo Nonogaki, the Society of Polymers ed., "Micropatterning and Resist", p. 11, Q. 3, Kyoritsu-shuppan, 1990) having rubber with a high contact force and mechanical strength is used.

For this reason, this embodiment used OMR-83.

After the adhesion layer 97 was formed, the third substrate shown in (b) in FIG. 11 and the second substrate shown in (c) in FIG. 11 were brought into contact with each other by pressurizing them from their rear surface sides. Then, these substrates were subjected to a heat treatment at 150° C. to cure the adhesion layer, thereby adhering the substrates, as shown in (d) in FIG. 11.

Since the beam pattern 94 had been formed on the crystalline silicon film 93, a groove was formed on the third substrate, and the vapor of the organic solvent generated upon heating and curing the adhesion layer could be escaped via the groove, thus preventing bubbles from remaining.

The film thickness of the cured adhesion layer was 2 μm.

Thereafter, the silicon substrate 91 of the third substrate was removed from the adhered substrates shown in (d) in FIG. 11 by etching in a 30 wt % aqueous KOH solution at 80° C., and the insulating layer 92 was removed therefrom using an aqueous HF solution ((e) in FIG. 11).

A 50-nm thick Pt film was formed by a sputtering method using a Pt target, a photoresist 110 was coated and patterned by a photolithography process, and the Pt film was subjected to ion milling by Ar ions using the photoresist 110 as a mask, thus forming a joining layer 78, as sown in (f) in FIG. 11.

Thereafter, the photoresist 110 and a portion of the adhesion layer 97 were etched by reactive ion etching using oxygen gas, as shown in (g) in FIG. 11.

A 1-μm Al film 98 serving as a support layer was formed on the beam pattern and the joining layer by an ion beam sputtering method using an Al target, as one of vacuum deposition methods.

A photoresist 111 was applied, exposed, and developed on the Al film 98 in a photolithography process ((h) in FIG. 12), and the Al film 98 was patterned using an Al etchant containing phosphoric acid, nitric acid, and acetic acid, thereby forming patterns of support portions 83 and 84 in FIGS. 10A and 10B on a torsion beam 82.

Furthermore, the photoresist 111 was removed by reactive ion etching using oxygen gas ((i) in FIG. 12).

A first substrate 71 was prepared following the same processes shown in (a) to (d) in FIG. 3 until a tip material layer was formed, i.e., had a contact layer 76 and a tip material layer 77 obtained by forming a 1-μm thick Au film serving as a micro-tip material on a peeling layer 75. The tip material layer 77 on the first substrate 71 and the joining layer 78 were aligned and joined ((j) in FIG. 12).

The joining process is attained using a method of contacting the first and second substrates by pressurizing their rear surfaces.

In this manner, the two Au layers were joined, i.e., the tip material layer 77 and the joining layer 78 were joined, and by peeling the first substrate from the second substrate after they were in contact with each other, only the Au layer on the peeling layer was transferred onto the joining layer 78, thus forming a micro-tip 80.

A photoresist 112 was applied on the second substrate ((k) in FIG. 12), and a portion of the silicon substrate 95 was etched from the rear surface side of the second substrate by crystallographic-axis anisotropic etching using a potassium hydroxide aqueous solution so as to form a silicon block 104. Furthermore, the silicon nitride film 100 of the thin-film flat plate portion was removed from the rear surface side by reactive ion etching using $CF_4$ gas ((l) in FIG. 12).

Finally, the photoresist 111 and the adhesion layer 97 consisting of the resin film of the thin-film flat plate lower portion were ashed using an oxygen plasma, thus forming a gap 102.

With the above-mentioned formation method, a probe with an electrostatic actuator function shown in FIGS. 10A and 10B, which probe had the gap 102 shown in (m) in FIG. 12, comprised the crystalline silicon torsion beams 82, the thin-film flat plate 81, and the micro-tip 80 formed on the joining layer, and was supported by the Al support portions 83 and 84, was formed.

The respective electrodes are never etched by ashing using an oxygen plasma, and sticking that poses a problem upon removing sacrificial layers by conventional wet etching can be avoided.

According to the formation method of the present invention, since the thin-film flat plate consisted of crystalline silicon, a probe which essentially had no internal stress, i.e., was free from any warp could be manufactured.

When a voltage was applied across the stationary electrodes 85 and 86, the free end of the flat-plate electrode portion was displaced in the silicon block direction, and the free end of the flexible beam was displaced in a direction opposite to that of the free end of the flat-plate electrode portion in correspondence with the torsional rotation of the torsion beam. In the probe manufactured by the manufacturing method of the present invention, since the laser beam can be reflected by the rear surface of the joining layer formed on the distal end of the flexible beam for the purpose of attaining AFM displacement measurement, a reflection film can be omitted.

With this structure, no reflection film need be formed on the entire rear surface of the flexible beam, and the thin-film flat plate is free from any warp due to the film stress of the reflection film.

In this embodiment, the adhesion layer is formed on the second substrate, and is adhered to the third substrate. However, even when the adhesion layer is formed on the third substrate or both the second and third substrates, and thereafter, these substrates are adhered to each other, the same probe can be formed.

[Seventh Embodiment]

A multi-probe structure in which a plurality of probes each having an electrostatic actuator function of the present invention described in the sixth embodiment are formed on a single substrate will be described below as the seventh embodiment of the present invention.

Figure 13:
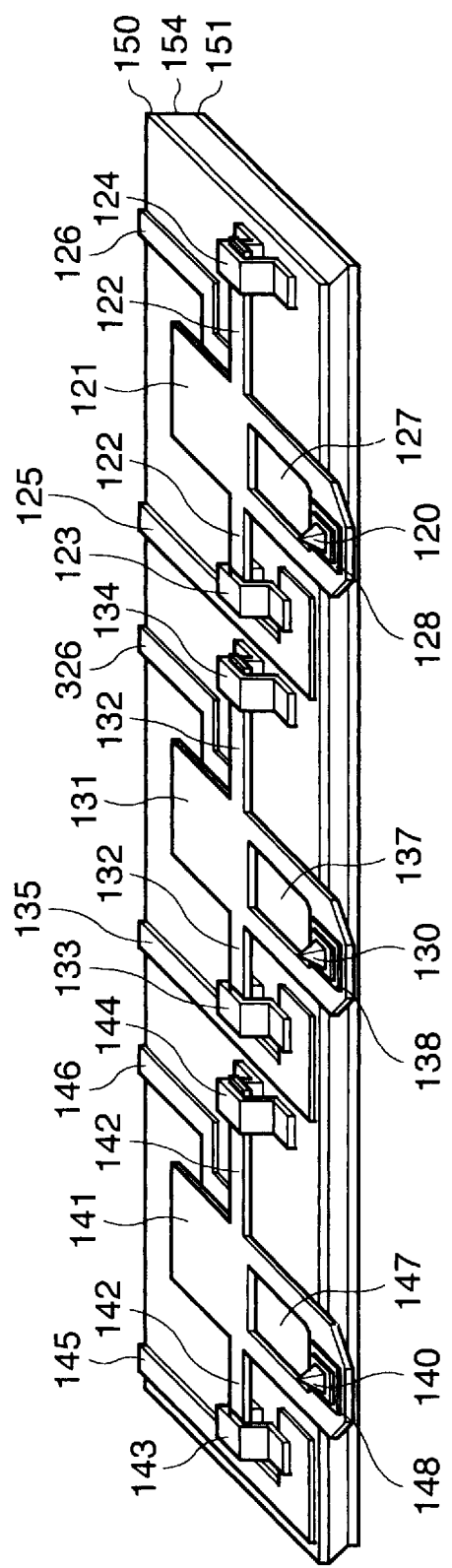
FIG. 13 is a perspective view for explaining a multi-probe structure in which a plurality of probes according to the sixth embodiment of the present invention are formed on a single substrate.

FIG. 13 is a perspective view for explaining a multi-probe structure in which a plurality of probes shown in FIGS. 10A and 10B are formed on a silicon block 154 formed with silicon nitride films 150 and 151.

As can be seen from FIG. 13, the multi-probe structure of the present invention is as follows.

Thin-film flat plates 121, 131, and 141 respectively have torsion beams 122, 132, and 142 on their side surfaces, and depend from the upper surfaces of the corresponding torsion beams via support portions 123 and 124, 133 and 134, and 143 and 144.

The thin-film flat plates 121, 131, and 141 respectively have adhesion layers 128, 138, and 148, and micro-tips 120, 130, and 140.

These probes have pairs of stationary electrodes 125 and 126, 135 and 136, and 145 and 146. When a voltage is applied across the pair of stationary electrodes, each probe can be independently displaced about the axis of rotation of their torsion beams.

Since each thin-film flat plate consists of crystalline silicon, a probe which essentially has no internal stress, i.e., is free from any warp can be manufactured. Also, since micro-tips, which are manufactured by the method of manufacturing a micro-tip of the present invention and have uniform shapes, are used, variations in height of the silicon block and tips due to warps of cantilevers and the like, and variations in height of the tips that pose a problem in a multi-probe structure can be suppressed, thus providing a multi-probe structure with high manufacturing reproducibility.

In the method of manufacturing a micro-tip of the present invention, since a micro-tip can be easily formed by the arrangement of the peeling layer and the contact layer without removing a female mold substrate as the first substrate by etching, the female mold can be repetitively reused, thus realizing improvement in productivity and a reduction of the manufacturing cost.

Since a micro-tip can be formed not by etching but by a transfer process, deterioration of the material and shape of a micro-tip due to an etchant and contamination from an etchant can be prevented.

Furthermore, according to the method of manufacturing a micro-tip of the present invention, a micro-tip portion with a sharp distal end can be uniformly formed with high reproducibility, and a multi-tip structure can be readily realized. Hence, a micro-tip with excellent characteristics for an AFM or STM can be manufactured. When this micro-tip consists of a metal material, a stable micro-tip with higher reproducibility can be realized as that for an STM.

When a thin-film cantilever with a joining layer is formed in advance on the second substrate, not only the manufacture of a probe for an AFM that consists of only a thin-film cantilever with a tip is facilitated, but also no reflection film need be formed since the joining layer is formed only on the distal end of the thin-film cantilever. In addition, a warp of the thin-film cantilever due to formation of the reflection film can be avoided.

Since the arrangement in which an adhesion layer consisting of a resin film is formed on the second substrate and the third substrate is adhered thereto and is patterned to form a thin-film flat plate in advance is adopted, the manufacture of a probe with an electrostatic actuator function for an AFM or STM can be easily realized.

When the torsion beams and the thin-film flat plate for the probe for an AFM or STM consist of crystalline silicon, a probe free from any warp can be manufactured with high reproducibility.

Since a resin film used as the adhesion layer has both a function of adhering the second and third substrates and a function of a sacrificial layer to be removed in the final process in the manufacture, dry etching using oxygen gas can be used as a method of removing the resin film, and sticking that poses a problem upon removing a sacrificial layer in a conventional method can be avoided.

Since this resin layer can form a flat surface independently of three-dimensional patterns such as an electrode pattern formed on the substrate, an adhering process can be satisfactorily attained independently of the surface roughness of the substrate.

What is claimed is:

1. A method of manufacturing a micro-tip, comprising the steps of:

forming a recess portion for forming a tip on a first substrate;

forming a peeling layer on said recess portion;

forming a contact layer on at least a portion, other than said peeling layer, on said substrate;

bonding a tip material layer on said peeling layer and said contact layer, with said tip material layer having a bond to said contact layer stronger than a bond to said peeling layer; and transferring said top material layer on said peeling layer onto a second substrate.

2. A method according to claim 1, wherein said contact layer comprises silicon.

3. A method according to claim 1, wherein said peeling layer comprises silicon dioxide.

4. A method according to claim 1, wherein said first substrate comprises monocrystalline silicon.

5. A method according to claim 4, wherein said recess portion is formed by crystallographic-axis anisotropic etching.

6. A method according to claim 1, wherein said contact layer comprises Al.

7. A method according to claim 1, wherein said peeling layer comprises Cr.

8. A method according to claim 1, wherein the transferring step includes the step of transferring said tip material layer onto said second substrate by a pressure contact process.

9. A method according to claim 1, further comprising the step of:

forming a joining layer on a portion, to which said tip material layer is to be transferred, on said second substrate.

10. A method according to claim 9, wherein said joining layer comprises a metal.

11. A female mold substrate used in the manufacture of a micro-tip, comprising:

a substrate;

a peeling layer formed on a recess portion in said substrate and serving as a female mold and being capable of peeling away from a tip material; and a contact layer formed on at least a portion, other than said peeling layer, on said substrate, with said contact layer forming a bond with the tip material stronger than a bond between said peeling layer and the tip material.

12. A method of manufacturing a probe with a micro-tip, comprising the steps of:

forming a recess portion for forming a tip on a first substrate;

forming a peeling layer on said recess portion;

forming a contact layer on at least a portion, other than said peeling layer, on said substrate;

bonding a tip material layer on said peeling layer and said contact layer, with said tip material layer having a bond to said contact layer stronger than a bond to said peeling layer;

transferring said tip material layer on said peeling layer onto a second substrate; and forming a probe by processing said second substrate.

13. A method according to claim 12, wherein the probe forming step further comprises the steps of:

forming a thin-film cantilever on said second substrate;

forming a joining layer on said thin-film cantilever; and removing a portion of said second substrate underneath said thin-film cantilever so that only one end of said thin-film cantilever is fixed to said second substrate.

14. A method according to claim 12, wherein the probe forming step further comprises the steps of:

forming an adhesion layer comprising a resin layer on said second substrate and/or a third substrate formed with a beam pattern;

adhering said second and third substrates via said adhesion layer;

shaping said third substrate into a thin-film flat plate on said second substrate;

forming a joining layer, to which said tip material layer is to be transferred, on said thin-film flat plate;

forming support portions for connecting said thin-film flat plate to said second substrate; and forming a gap between said thin-film flat plate and said second substrate by removing said adhesion layer underneath said thin-film flat plate on said second substrate.

15. A method according to claim 14, wherein said third substrate comprises an SOI substrate.

* * * * *

UNITED STATES PATENT AND TRADEMARK OFFICE
CERTIFICATE OF CORRECTION

PATENT NO. : 5,866,021

DATED : February 2, 1999

INVENTOR(S) : Yagi et al.

It is certified that error appears in the above-identified patent and that said Letters Patent is hereby corrected as shown below:

COLUMN 11:

Line 66, "Q.3," should read --1. 3--.

Signed and Sealed this

Twenty-second Day of May, 2001

Attest:

NICHOLAS P. GODICI

Attesting Officer     Acting Director of the United States Patent and Trademark Office